United States Patent
Paul et al.

(10) Patent No.: US 7,446,505 B2
(45) Date of Patent: Nov. 4, 2008

(54) SYSTEM AND METHOD FOR CALCULATING A STATE OF CHARGE OF A BATTERY

(75) Inventors: Christopher R. Paul, Bayport, NY (US); Benjamin Bekritsky, Hollis, NY (US); Joseph Cabana, Centereach, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 11/509,466

(22) Filed: Aug. 24, 2006

(65) Prior Publication Data

US 2008/0048616 A1    Feb. 28, 2008

(51) Int. Cl.
*H01M 10/44* (2006.01)
*H01M 10/46* (2006.01)

(52) U.S. Cl. .................................................. 320/132

(58) Field of Classification Search ............... 320/107, 320/132, 149
See application file for complete search history.

(56) References Cited

U.S. PATENT DOCUMENTS

| | | | |
|---|---|---|---|
| 6,549,014 B1 * | 4/2003 | Kutkut et al. | 324/426 |
| 7,136,762 B2 * | 11/2006 | Ono | 702/63 |
| 2002/0101243 A1 | 8/2002 | Mentgen et al. | |

FOREIGN PATENT DOCUMENTS

WO    2005/085889    9/2005

* cited by examiner

*Primary Examiner*—Edward Tso
(74) *Attorney, Agent, or Firm*—Fay Kaplun & Marcin, LLP

(57) ABSTRACT

Described is a system and method for determining determining a present state of charge of a battery and determining a rate of change of the state of charge of the battery, the rate of change being determined based on a charge current being supplied to the battery. Then, an updated state of charge is determined based on the rate of change.

23 Claims, 3 Drawing Sheets

SYSTEM AND METHOD FOR CALCULATING A STATE OF CHARGE OF A BATTERY

BACKGROUND

Users of mobile units such as computers benefit from having access to State of Charge (SOC) information about the battery powering the device, during both the discharging and charging phases of operation. The chief benefits come from knowing what portion of the battery energy remains during discharge and how much remains to be charged during charging. The generation of this SOC information is traditionally facilitated by a "coulomb counter" (CC), which is a circuit capable of counting all of the charge in the highly complex, high frequency current load waveforms encountered in mobile devices. When the battery is either fully discharged or fully charged, the CC is initialized accordingly. Knowledge of battery capacity coupled with the CC value is used to provide SOC information.

Some systems do not employ CC's for reasons of cost or unavailability at the time of design. Instead, less accurate techniques for determining SOC during the discharge phase of operation are employed. For example, battery resistance over load current, temperature, and age is characterized and recorded, and a table of SOC is created as a function of open circuit battery voltage (OCBV). During discharge, average voltage, average current, and temperature are measured and used along with the battery characteristics to calculate an equivalent OCBV. An SOC is then derived from the OCBV look-up table. In another example, all loads in a computer are enumerated and their magnitudes measured and recorded. A counter is incremented during the activation of each load and a crude, open loop CC is thereby implemented. The CC is reinitialized whenever the battery is fully charged.

However, the above discussed techniques are not well suited to determine SOC when the battery is being charged. During the final portion of the charge cycle, the battery voltage is held constant as the current falls from a constant value that was held during the first portion of the charge cycle to a lower, termination current level. As would be understood by those skilled in the art, when the voltage is constant, it affords no SOC information using the first method described above. With the second method, the inaccuracy of the SOC estimate at the last instance of discharge leads to problems even if a CC were suddenly made available to integrate charge current. With no means available to correct the original SOC error, the reported SOC could easily over or undershoot the actual SOC. As a result, the calculated SOC could reach 100% before the battery finishes charging (leading the user to remove the battery prematurely) or the battery could reach full charge but still indicate an SOC of under 100% (leading to wasted time).

SUMMARY OF THE INVENTION

A method for determining a present state of charge of a battery, determining a rate of change of the state of charge of the battery, the rate of change being determined based on a charge current being supplied to the battery and determining an updated state of charge based on the rate of change.

A system having a current sensor measuring a charge current being supplied to a rechargeable battery and a processor calculating a rate of change of a state of charge of the rechargeable battery based on the charge current, the processor using the rate of change to calculate an updated state of charge of the rechargeable battery.

DETAILED DESCRIPTION

Figure 1:
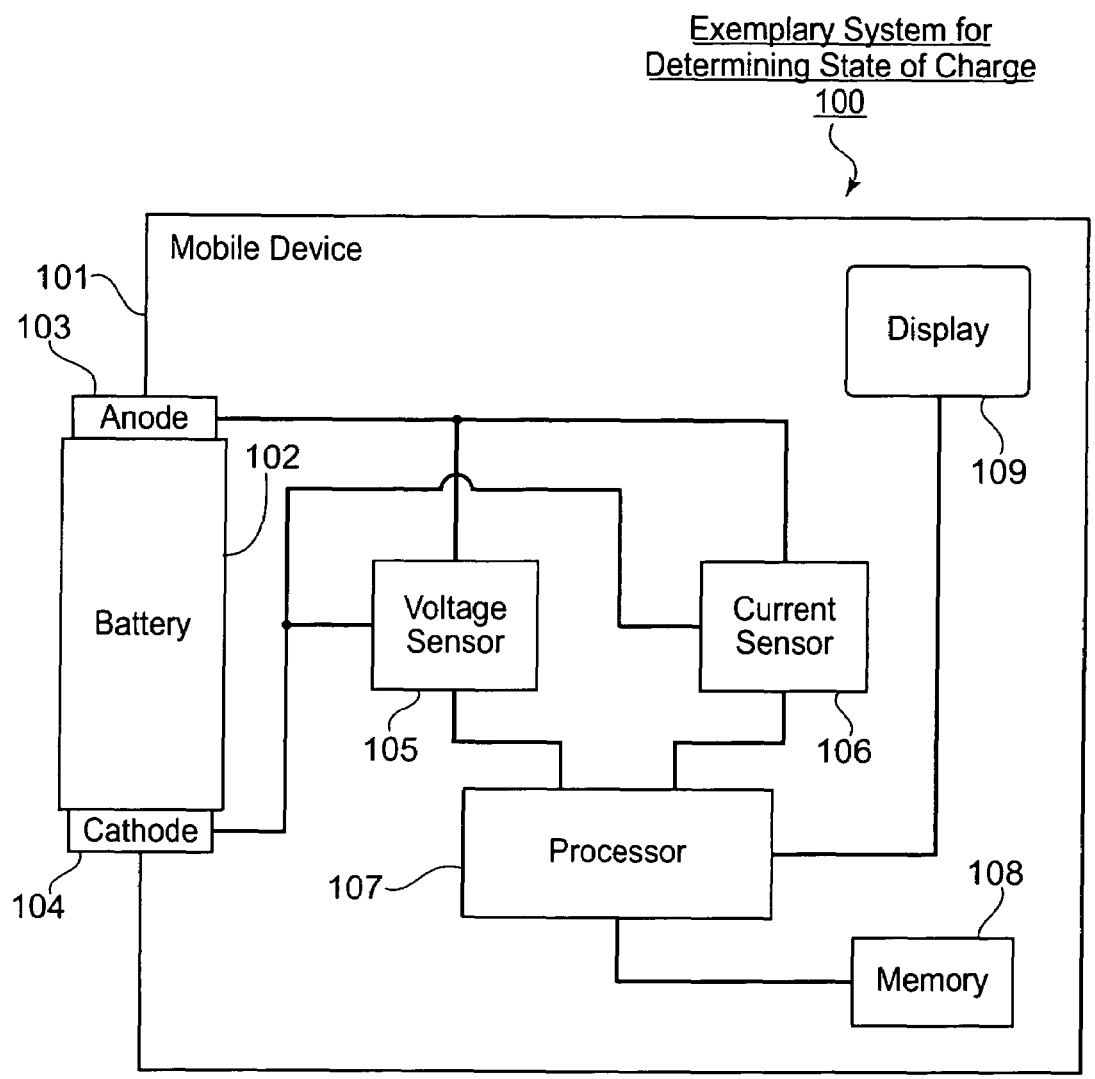
FIG. 1 illustrates an exemplary charging system of a mobile device calculating SOC according to the present invention.

The present invention may be further understood with reference to the following description and the appended drawings, wherein like elements are referred to with the same reference numerals. The exemplary embodiment of the present invention describes a system and method for calculating a state of charge (SOC) during a charging phase without a coulomb counter. The calculations and state of charge will be discussed in detail below.

FIG. 1 illustrates an exemplary charging system 100 of a mobile device 101 for calculating SOC according to the present invention. The exemplary embodiment of the charging system 100 is described with reference to each of the components being part of a mobile device 101 and the procedure being carried out when the battery is inserted in the mobile device. However, those skilled in the art will understand that the exemplary system and method do not need to be implemented as part of a mobile device. For example, the charging system 100 and the accompanying method may be implemented in a standalone charger, e.g., the battery is removed from the mobile device and placed by itself in a charging cradle that implements the present invention. In a further exemplary embodiment, the mobile device may be placed in a charging cradle for battery charging and some of the components for implementing the present invention may be included in the mobile device and some may be included in the charging cradle. However, for the purposes of describing the exemplary embodiment, it will be considered that the charging system 100 is included entirely in the mobile device 101.

The charging system 100 includes several exemplary components. Initially, a battery 102 is loaded into the mobile device 101. The battery 102 in the exemplary embodiment is a lithium ion battery. It should be noted, as would be understood by those skilled in the art, that the battery 102 is loaded into the mobile device 101 in a correct configuration to place the proper anode 103/cathode 104 with the corresponding terminals of the mobile device 101.

The mobile device 101 includes a voltage sensor 105 and a current sensor 106 for measuring the charge voltage and charge current, respectively, for the battery 102. The battery charger 101 further includes a processor 107 including the algorithms (or programming) necessary to calculate the SOC of the battery 102. The algorithms will be discussed in more detail below. Connected to the processor 107 is a memory 108. The memory 108 serves as a storage unit of information. The information is used in the algorithms of the processor 107. The processor 107 is also connected to a display 109. The display 109 may be used to indicate a progress of the charging of the battery 102 (e.g., 80% charged, 90% charged, etc.). The display 109 may be digital or analog. As the battery 102 charges, the display 109 may indicate the SOC currently on the battery 102. It should also be noted that the display may simply be an indicator for when the battery 102 is fully charged. For example, the display 109 may be one or more light emitting diodes (e.g., red when not fully charged, green when fully charged) or a speaker (e.g., emitting a tone when the battery is fully charged) that are activated upon charging the battery 102.

Those skilled in the art will understand that some mobile devices already include all the components described above for the charger system 100. Thus, these types of mobile devices merely need to add the functionality (e.g., the processor programming) described below to implement the SOC calculation. While other mobile devices may not include all the exemplary components described above and may need to add the components or use other components to perform equivalent functions. Thus, it should be noted that the above description of components are only exemplary and that a charger system according to the present invention may implement more or less components. For example, a separate current sensor may not be needed because most charge integrated circuits develop a voltage proportional to the charge current across a ground reference resistor which determines the magnitude of a fast charge current. This voltage may be directly sampled by an analog to digital converter that may be already available in a microprocessor on board the mobile device 101.

Figure 3:
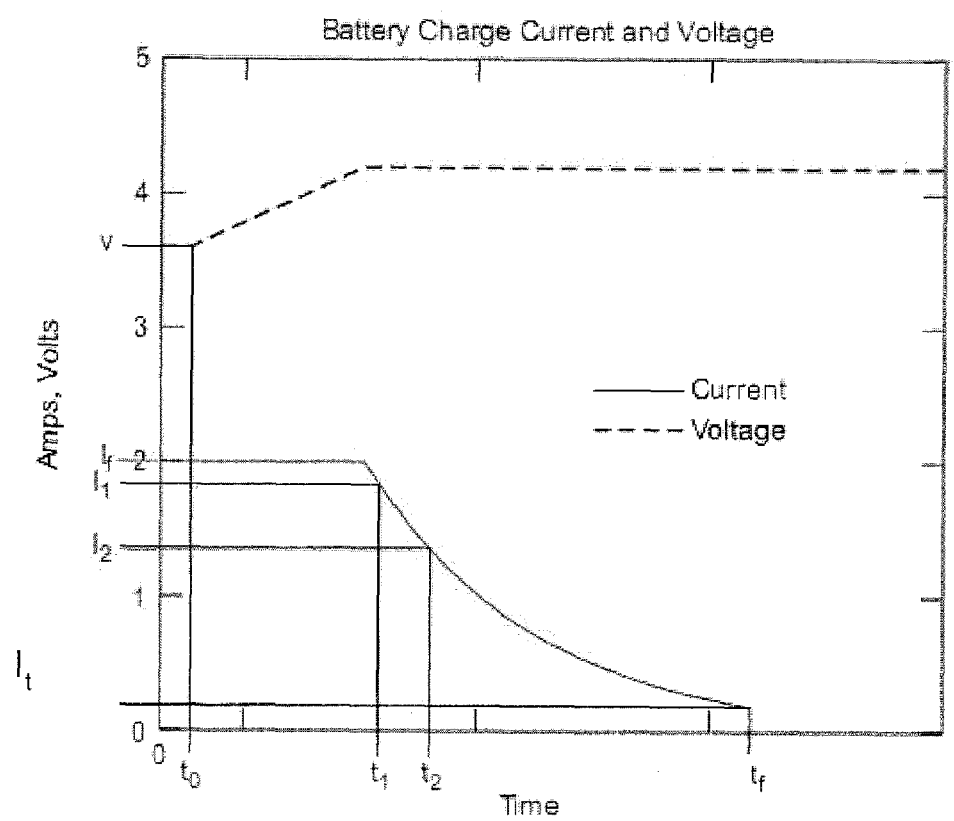
FIG. 3 illustrates a graph for charging a battery showing a curve of current and a curve of voltage with respect to time.

FIG. 3 illustrates an exemplary graph for charging a battery showing a current curve and a voltage curve with respect to time. The curve of current (solid line) begins at $I_f$ and eventually decreases to $I_t$. The curve of voltage (dotted line) begins at a measured voltage V, e.g., the voltage of the battery 202 at the time when charging begins labeled as $t_0$ on the graph. From time $t_0$ to just before time $t_1$, the charging cycle is shown to be in the constant current phase, i.e., the charge current is the constant fast charge current $I_f$ and the voltage is steadily rising to a maximum voltage value. Upon reaching the maximum voltage value, the charging cycle goes into a constant voltage phase, i.e., the charge voltage remains constant and the charge current drops exponentially from $I_f$ to the termination charge current $I_t$ at time $t_f$ (the termination time of the charging cycle).

As can be seen from the exemplary graph of FIG. 3, there is a great deal of information about battery SOC that may be captured from the charge current during the constant voltage phase. The charge current varies slowly in comparison with the typically rapidly varying discharge current. Thus, the charge current may be sampled relatively infrequently without the loss of information. The graph of FIG. 3 will be used later to provide a description of an exemplary method according to the present invention.

Figure 2:
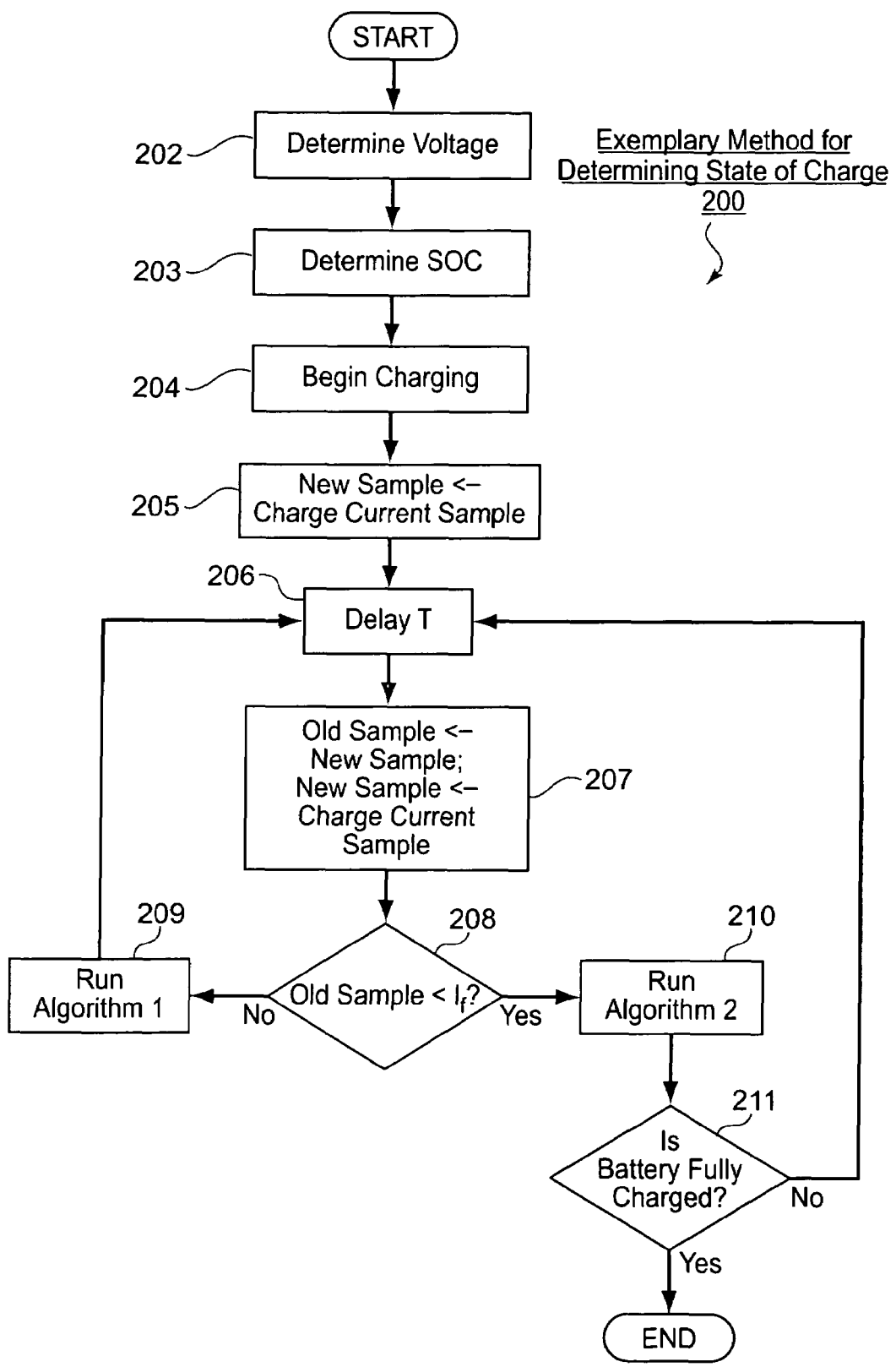
FIG. 2 illustrates an exemplary method of charging a battery for calculating SOC according to the present invention.

FIG. 2 illustrates an exemplary method 200 of a charger system 100 for calculating SOC of a battery 102 according to the present invention. The method 200 will be described with reference to the charger system 100 described in FIG. 1 and the charging cycle graph of FIG. 3. The charging of the battery 102 may be accomplished in any conventional manner. For example, the mobile device 101 may be placed in a charging cradle to supply charging power to the mobile device 101. The mobile device 101 may be plugged into a wall outlet or other power source via a connection on the mobile device 101.

In step 202, the current state of voltage is determined using the voltage sensor 105. Those of skill in the art will understand that in a rechargeable battery (e.g., lithium ion batteries), as current is discharged through use of the battery 102, the voltage potential of the battery 102 decreases. In addition, the discharge rate may vary greatly depending on the type of use of the battery 102. Thus, in step 202, the amount of voltage present in the battery 102 is measured. The voltage found in step 202 may be stored in the memory 108. For example, referring to FIG. 3, the charging process may begin at time $t_0$ and the measured voltage may be V.

In step 203, a SOC is determined. The SOC may be expressed in various manners. However, the most common expression is a battery's available capacity expressed as a percentage of its rated capacity (e.g., 10%, 20%, 99%). In this embodiment, the SOC expresses, as a percent, the amount of capacity currently present in the battery 102 compared to the amount of total capacity possible in the battery 102. That is, in the discharge phase, the SOC tells a user how much longer a battery will continue to perform before it needs recharging. Conversely, in the charge phase, the SOC also tells a user how much longer a battery requires charging. The determination of the SOC at this point may be an estimation. For example, the memory 108 may include information that indicates that a certain Open Circuit Battery Voltage (OCBV) level corresponds to an SOC (e.g., OCBV (3.75V)=15% SOC). In another example, the processor may already include the estimation based on the SOC that is determined during the drainage of the battery 102. The SOC found in step 203 is used for further calculations that will be discussed below. The SOC found in step 203 may also be stored in the memory 108.

Upon determining the amount of voltage and the SOC of the battery 102, in step 204, the charging of the battery 102 begins. As discussed above, in comparison to the discharge phase, the charging current changes very slowly. Accordingly, the present exemplary method utilizes the slow changing function by sampling infrequently without loss of information.

Once charging begins in step 204, a sample of the charge current of the battery 102 is taken in step 205. The sample may be taken using the current sensor 106 or, as described above, charge current measurement is readily available to most devices having a charge IC based on the development of a voltage proportional to charge current across a ground referenced resistor. After this first sample is taken, the rate of change of the SOC is not known and is therefore set to 0.

After a delay time as shown in step 206, a new sample charge current is taken in step 207. The delay time is some time T later than the first measurement of charge current described with reference to step 205, e.g., T=5 minutes. The next sample charge current may be taken at an incremental time later to be preset or randomly done. For example, the second measurement described herein may occur at time t1 as shown in the graph of FIG. 3. In addition, at step 207, the original current sample (e.g., the sample taken at step 205) is set to be the old sample and the new measurement is set to be the new sample.

The charge current sample that is taken in step 205 (i.e., the sample that is currently set to be the old sample) is compared to the $I_f$ in step 208. The processor 107 may have information that indicates the fast charge current $I_f$, the termination charge current $I_t$ and the nominal capacity (C) in MaHrs of the battery it is charging. If the old sample is found to be greater than or nominally equal to $I_f$, then the method continues to step 209, where a first algorithm (algorithm1) is run. If the old sample is found to be nominally less than $I_f$, then the method continues to step 210, where a second algorithm (algorithm2) is run. Algorithm1 and algorithm2 will be discussed in detail below.

As discussed in step 205, sample charge currents may be taken. For example, as illustrated in FIG. 3, the first current measurement may be taken at time $t_0$ and, in this example, in step 208, the charge current will be determined to be approximately $I_f$. Thus, the process would continue to step 209 to run algorithm1. Those skilled in the art will understand that when the charge current is equal to $I_f$, the charging cycle is in the constant current phase. While the graph of FIG. 3 shows that the charging operation starts in the constant current phase, it is not required that the charging operation begins in this phase.

Referring back to FIG. 2, at step 209, the algorithm1 is run. To run algorithm1, the original charge current sample (e.g., the sample taken at step 205 and set to be the old sample at step 207) and the new charge current (e.g., the sample taken at step 207 and set to be the new sample) are used. Using these measurements, the rate of change (ROC) in percent per minute of the SOC may bet determined. Recall that after the first measurement, the ROC is set to 0. The new ROC may be determined using the following:

$$ROC = 100 \times (I_{old} + I_{new})/(2 \times C \times 60)$$

Where $I_{old}$=Initial current measurement in milliamperes (e.g., current measurement taken at time $t_0$ (step 205);
$I_{new}$=second current measurement in milliamperes (e.g., current measurement taken at time $t_1$ (step 207);
C=capacity of battery in milliampere-hours This operation allows a new ROC value to be set. Upon determining a value of ROC, the following operation may be performed.

$$SOC_{new} = SOC_{old} + ROC \times T$$

Where $SOC_{old}$=initial value of the SOC (e.g., set in step 203); and
T=time period between current measurements (e.g., $t_1-t_0$).

Thus, this operation allows an SOC value to be set. Those skilled in the art will understand that the algorithm1 may be embodied as a set of instructions that are executable by the processor 107. The processor may use inputs from the voltage sensor 105, current sensor 106 and/or previously stored values in the memory 108 as inputs for executing the algorithm1.

It should be noted that the process will then go back to step 206, where after a particular delay time (either the same delay between the first and second measurements or some other delay time), the process continues to step 207 where a new sample charge current will be taken and considered to be the new current charge, e.g., $I_{new}$. Also, in step 207, the previous measurement taken during the first pass through step 207, will be set to be the old sample. The step of 208 will then be repeated and, if, the current sample charge current is still nominally $I_f$, the process will continue back to step 209 to run algorithm1. Any subsequent SOC evaluation uses the previously determined $SOC_{new}$ value. In no case shall $SOC_{new}$ be permitted to reach 100%, which otherwise could happen if the initial SOC estimate were too high. The battery cannot be fully charged if the charging current were still nominally $I_f$ (that is, the charge regime were still in the constant current mode.)

In the example shown in FIG. 3, the initial $I_{new}$ is not nominally $I_f$. Thus, in step 208 it will be determined that the sample charge current found in step 207 (e.g., $I_1$) is less than $I_f$, and the method will proceed to step 210, where the algorithm2 is run. If the sample charge current is nominally less than $I_f$, then the charge cycle is now in the constant voltage portion of the graph. Correspondingly, the current follows an exponential decay with a time constant that may vary with battery temperature, age, contact cleanliness, and/or battery cell chemistry. Despite the variables that may affect the time constant, as mentioned above, the values of $I_1$, $I_2$, $t_1$, and $t_2$ with the knowledge of the decay being exponential may still be used. It should be noted that assuming a time, $t_3$, that is later in time than $t_2$ by a time, T, those of skill in the art will understand that a corresponding sample charge current $I_3$ is expected to have a value of $I_2 \times (I_2/I_1)$. Therefore, the algorithm2 may be performed with the following steps.

```
Ratio = I₂/I₁
If Ratio < 1
{
    TTT = T;              \* TTT is Time to
                             Terminate*\
    I = I₂;
    Do While (I = I × Ratio > I₁)   {TTT = TTT +
                                      T};
    ROC = (100 − SOC_old)/TTT;
}
SOC = SOC + ROC × T
```

It should be noted that if the ratio is determined to not be less than 1, a new ROC is not calculated. Instead, the prior ROC is simply reused, since it presumably has not changed since the charge currents have not changed. This situation would be very unusual and would be indicative of a very long exponential decay time constant, or perhaps a selection of too high a sample rate. Still, the state of charge has changed since time has passed. So, we calculate $$SOC = SOC + ROC \times T$$

It should also be noted that the ROC is approximately constant over any one period T. Further, it should be noted, as discussed above with algorithm1, the SOC should be prevented from reaching 100% until charging is completed. All values from prior executions of algorithm2 may be stored in memory 108.

The selection of a value for an update rate of T is a compromise. For example, if T is too large, then TTT would have inadequate resolution. If T is too small, then the value ratio might be unduly affected by the noise of the charger's current charge or the resolution of the ADC. The added noise may also lead to an inadequately frequent update of the value of SOC displayed to the user. If the variable t is defined as the elapsed time since the most recent current-sample, then more time resolution of the SOC may be provided by displaying it to the user using the following operation.

$$SOC_{display} = SOC + ROC \times t$$

$SOC_{display}$ is the SOC that is displayed to the user. Again, as discussed above, it should be noted that the $SOC_{display}$ should be prevented from reaching 100% until charging is complete. In addition, as more and more sample current charges may be taken, a new value of $SOC_{display}$ may be calculated and displayed as frequently as desired.

As FIG. 2 illustrates, step 210 is executed when the prior sample charge current is nominally $I_f$ which involves the constant current curve and a steadily increasing voltage curve. Then, after the fast charge rate is complete, step 210 is executed when the prior sample charge current is nominally less than $I_f$ which involves the exponential decay of the current curve and a constant voltage curve. Thus, after step 210, step 211 determines if the battery is fully charged. If the battery is still not fully charged, the method returns to step 206.

If, however, step 211 determines that the battery is fully charged, then the method ends. An exemplary criteria for determining that the battery is fully charged may be to determine that the charging current falls below $I_t$. This check may be performed on a plurality of samples to ensure that a one time noise spike does not prematurely halt charging. However, those skilled in the art will understand that there may be other methods of determining whether the battery is fully charged and the exemplary embodiments of present invention may implement any of these methods. At the end of the method, the SOC is set to the value of 100% and this value is displayed to the user. All displays may be shown using the display 109.

As would be understood by those skilled in the art, it should be noted that there are other ways of estimating SOC during the constant voltage phase of charging. The other ways may include, for example, storing a table of charging currents to SOC percentages. These values may be stored in the memory 108.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A method, comprising:
   determining a first state of charge of a battery;
   determining a rate of change of the state of charge of the battery, the rate of change being determined based on a charge current being supplied to the battery; and
   determining an updated state of charge as a function of only the first state of charge, the rate of change, and a time period from the determining the first state of charge and the updated state of charge.

2. The method of claim 1, further comprising:
   displaying the updated state of charge.

3. The method of claim 1, wherein the first state of charge is determined based on an open circuit battery voltage.

4. The method of claim 1, wherein the first state of charge is determined based on information received from a calculation of the state of charge during the discharging of the battery.

5. The method of claim 1, wherein at least two measurements of charge current are used to determine the rate of change.

6. The method of claim 5, wherein, when a first of the at least two measurements of charge current is substantially equal to a fast charge current, the rate of change is determined based on the following formula, $$ROC=100\times(I_{old}+I_{new})/(2\times C\times 60),$$

where ROC is the rate of change, $I_{old}$ is the first of the at least two measurements of charge current, $I_{new}$ is a second of the at least two measurements of charge current and C a capacity of the battery.

7. The method of claim 5, wherein, when a first of the at least two measurements of charge current is less than a fast charge current, a ratio of a second of the at least two measurements of charge current to the first of the at least two measurements of charge current is determined.

8. The method of claim 7, wherein, when the ratio is less than 1, the rate of change is determined based on the following formula, $$ROC=(100-SOC_{old})/TTT$$

where ROC is the rate of change, $SOC_{old}$ is the present state of charge and TTT is a time to terminate charging.

9. The method of claim 8, wherein the TTT is incremented by a predetermined value when the second of the at least two measurements multiplied by the ratio is greater than a charge termination current.

10. The method of claim 1, wherein measuring the charge current is performed one of periodically and non-periodically.

11. The method of claim 2, wherein the updated state of charge is displayed as a percentage of a capacity of the battery.

12. A system, comprising:
   a current sensor measuring a charge current being supplied to a rechargeable battery;
   a processor calculating a first state of charge of the rechargeable battery and calculating a rate of change of a state of charge of the rechargeable battery based on the charge current, the processor calculating an updated state of charge of the rechargeable battery as a function of only the first state of charge, the rate of change, and a time period from the determining the first state of charge and the undated state of charge.

13. The system of claim 12, further comprising:
   a voltage sensor measuring a voltage of the battery prior to a start of a charging operation, wherein the voltage is used by the processor to calculate the state of charge prior to the start of the charging operation.

14. The system of claim 12, further comprising:
   a display displaying the updated state of charge.

15. The system of claim 12, further comprising:
   a memory storing the charge current.

16. The system of claim 12, wherein the rechargeable battery is a lithium ion battery.

17. The system of claim 12, wherein at least two measurements of charge current are used to determine the rate of change.

18. The system of claim 17, wherein, when a first of the at least two measurements of charge current is substantially equal to a fast charge current, the rate of change is determined based on the following formula, $$ROC=100\times(I_{old}+I_{new})/(2\times C\times 60),$$

where ROC is the rate of change, $I_{old}$ is the first of the at least two measurements of charge current, $I_{new}$ is a second of the at least two measurements of charge current and C a capacity of the battery.

19. The system of claim 17, wherein, when a first of the at least two measurements of charge current is less than a fast charge current, a ratio of a second of the at least two measurements of charge current to the first of the at least two measurements of charge current is determined.

20. The system of claim 19, wherein, when the ratio is less than 1, the rate of change is determined based on the following formula, $$ROC=(100-SOC_{old})/TTT$$

where ROC is the rate of change, $SOC_{old}$ is the present state of charge and TTT is a time to terminate charging.

21. The system of claim 20, wherein the TTT is incremented by a predetermined value when the second of the at least two measurements multiplied by the ratio is greater than a charge termination current.

22. A device, comprising:
   current measuring means for measuring a charge current being supplied to a rechargeable battery;
   calculating means for calculating a first state of charge of the rechargeable battery;
   calculating means for calculating a rate of change of a state of charge of the rechargeable battery based on the charge current, the calculating means calculating an updated state of charge of the rechargeable battery as a function of only the first state of charge, the rate of change, and a time period from the determining the first state of charge and the updated state of charge.

23. A computer readable storage medium including a set of instructions executable by a processor, the set of instructions operable to:
   determine a first state of charge of a battery;
   receive an indication of a charge current being supplied to the battery;
   determine a rate of change of the state of charge of the battery, the rate of change being determined based on the indication of the charge current; and
   determine an updated state of charge as a function of only the first state of charge, the rate of change, and a time period from the determining the first state of charge and the updated state of charge.

* * * * *